(12) United States Patent
Hubbard et al.

(10) Patent No.: US 6,412,326 B1
(45) Date of Patent: Jul. 2, 2002

(54) SEMICONDUCTOR CALIBRATION STRUCTURES, SEMICONDUCTOR CALIBRATION WAFERS, CALIBRATION METHODS OF CALIBRATING SEMICONDUCTOR WAFER COATING SYSTEMS, SEMICONDUCTOR PROCESSING METHODS OF ASCERTAINING LAYER ALIGNMENT DURING PROCESSING AND CALIBRATION METHODS OF

(75) Inventors: Walter B. Hubbard; Lisa Napolitano, both of San Antonio, TX (US)

(73) Assignee: Philips Electronics North America Corp., New York, NY (US)

( * ) Notice: Subject to any disclaimer, the term of this patent is extended or adjusted under 35 U.S.C. 154(b) by 0 days.

(21) Appl. No.: 09/443,179

(22) Filed: Nov. 19, 1999

Related U.S. Application Data

(62) Division of application No. 09/087,764, filed on May 29, 1998, now Pat. No. 6,094,965.

(51) Int. Cl.$^7$ .............................................. H01L 21/00
(52) U.S. Cl. ........................ 73/1.01; 73/865.9; 438/14
(58) Field of Search ............................. 73/1.01; 438/7, 438/8, 9, 14, 16, 694, 697

(56) References Cited

U.S. PATENT DOCUMENTS

| | | |
|---|---|---|
| 4,875,989 A | 10/1989 | Davis et al. |
| 5,392,113 A | 2/1995 | Sayka et al. |
| 5,425,846 A | 6/1995 | Koze et al. |
| 5,426,073 A | 6/1995 | Imaoka et al. |
| 5,444,921 A | 8/1995 | Milina |
| 5,593,925 A | 1/1997 | Yamaha |
| 5,618,380 A | 4/1997 | Siems et al. |
| 5,675,402 A | 10/1997 | Cho et al. |
| 5,723,385 A | 3/1998 | Shen et al. |
| 5,792,673 A | * 8/1998 | Nagura .......................... 438/7 |

FOREIGN PATENT DOCUMENTS

| | | |
|---|---|---|
| EP | 856774 | * 8/1998 |
| JP | 122515 | * 5/1989 |
| JP | 202430 | * 8/1995 |
| JP | 213369 | * 8/1996 |
| JP | 343282 | * 8/1998 |
| JP | 284403 | * 10/1998 |

* cited by examiner

Primary Examiner—Hezron Williams
Assistant Examiner—Nashmiya Fayyaz
(74) Attorney, Agent, or Firm—P. Zawilski

(57) ABSTRACT

Semiconductor wafer coating system calibration structures and methods are described. In one embodiment, a calibration structure includes a perimetral edge bounding a calibration body. A calibration edge is spaced from the perimetral edge and is positioned over the calibration body. Together, the edges define a distance therebetween which is configured to calibrate a wafer coating system. In a preferred embodiment, the edges define respective termination distances configured to calibrate multiple different wafer coating systems. In another embodiment, a calibration pattern is formed over a semiconductor wafer. A layer of material is formed over the calibration pattern by a coating system, and selected portions thereof removed by the system. The positions of unremoved portions of the layer of material are inspected relative to the calibration pattern to ascertain whether the coating system removed the selected portions within desired tolerances. If not, the coating system is calibrated to within desired tolerances.

5 Claims, 4 Drawing Sheets

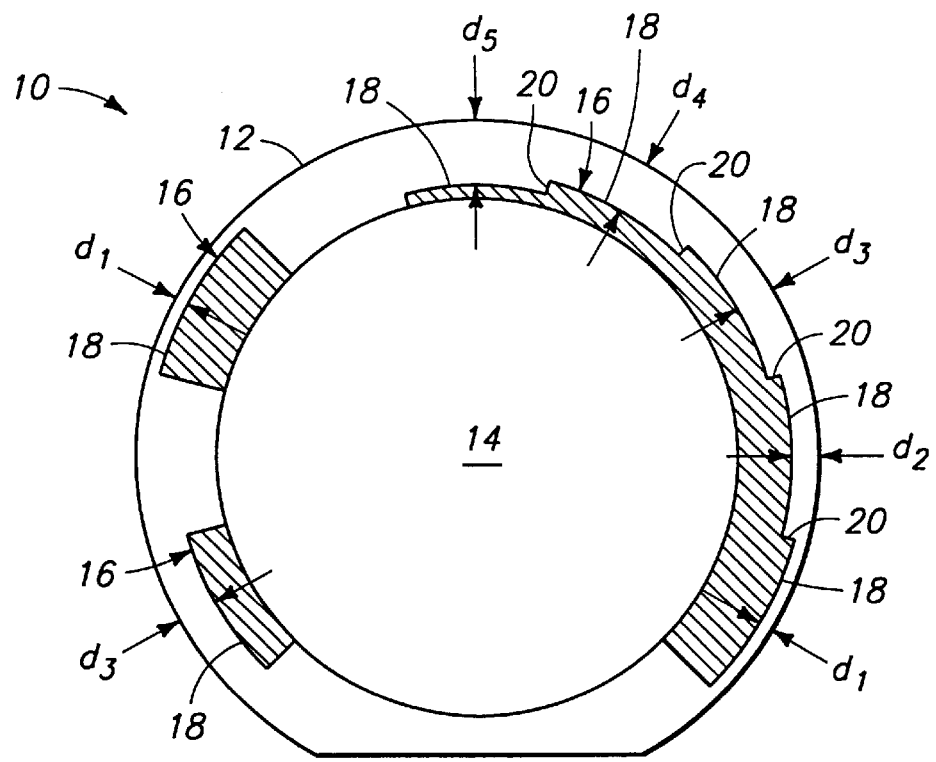
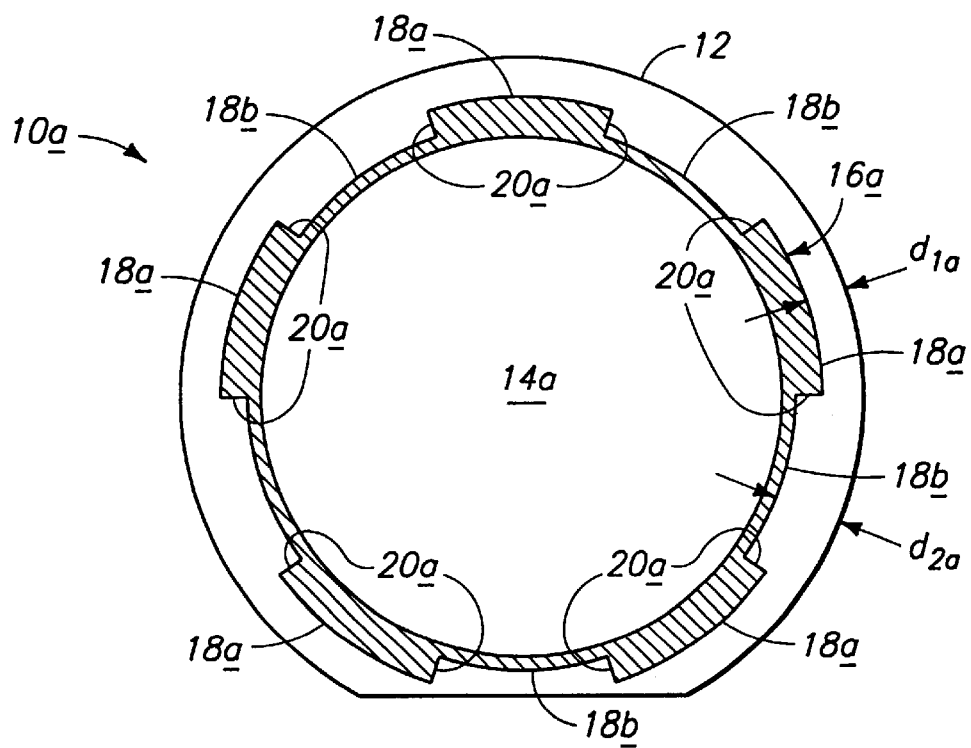

SEMICONDUCTOR CALIBRATION STRUCTURES, SEMICONDUCTOR CALIBRATION WAFERS, CALIBRATION METHODS OF CALIBRATING SEMICONDUCTOR WAFER COATING SYSTEMS, SEMICONDUCTOR PROCESSING METHODS OF ASCERTAINING LAYER ALIGNMENT DURING PROCESSING AND CALIBRATION METHODS OF

RELATED PATENT DATA

This patent resulted from a divisional application of U.S. patent application Ser. No. 09/087,764, which was filed on May 29, 1998 now U.S. Pat. No. 6,094,9.

TECHNICAL FIELD

The present invention relates to semiconductor calibration structures, semiconductor calibration wafers, calibration methods of calibrating semiconductor wafer coating systems, semiconductor processing methods of ascertaining layer alignment during processing, and calibration methods of calibrating multiple semiconductor wafer coating systems.

BACKGROUND OF THE INVENTION

During conventional applications of masking layers or photoresist layer coatings to semiconductor wafers, so-called coating systems are typically used. Such systems can include a flat, circular, disk-shaped, rotatable vacuum chuck having a diameter slightly less than that of a semiconductor wafer. The vacuum chuck can be used to hold and rotate a semiconductor wafer during application of the masking layer or photoresist. The vacuum chuck is typically oriented such that a semiconductor wafer placed thereon resides in a level horizontal plane. In operation, the bottom or inactive surface of a semiconductor wafer is placed on the vacuum chuck. The vacuum chuck applies a suction or negative pressure to the bottom surface of the semiconductor wafer to hold the semiconductor wafer thereon.

Typically, a desired amount of liquid photoresist is applied to the top, upwardly-facing surface of the semiconductor wafer, while the semiconductor wafer is being rotated on the vacuum chuck. Thus, as the semiconductor wafer is rotated, the photoresist material spreads radially outward from the center of the semiconductor wafer and toward the edge of the semiconductor wafer such that the entire top or active surface of the wafer is coated with a layer of photoresist. Excess photoresist material can be sloughed off the wafer during the rotation process. Excess amounts of photoresist, can, however, accumulate and form a mound or bead of photoresist on the outer edge of the semiconductor wafer. In order to eliminate the "edge bead" of photoresist, a coating system known as an edge bead removal unit can be employed.

Two types of edge bead removal units are well known in the art, chemical and optical. Chemical edge bead removal units include a nozzle which dispenses a solvent referred to as edge bead removal fluid, onto the photoresist at the edge of the semiconductor wafer. The solvent dissolves or develops away the photoresist and allows for easy removal of the photoresist from the edge of the semiconductor wafer. In an optical edge bead removal unit, the photoresist at or near the edge of the semiconductor wafer is exposed to light. During subsequent development processes, the exposed photoresist is removed. Photoresist which remains on the semiconductor wafer forms a mask for subsequent processing operations.

A problem which has arisen prior processes involves in inadvertent removing too much photoresist from the edge of semiconductor wafers thereby exposing substrate layers to undesirable etching operations. Another problem which has arisen in the context of the use of multiple coating systems, as is typical, is the inability to precisely control the amount of material removed as between these multiple coating systems.

Typically, several different edge bead removal units are utilized during fabrication of integrated circuit devices on semiconductor wafers. The use of different edge bead removal units commonly results in a random or haphazard stacking of substrate layers at or near the edge of the semiconductor wafer. The randomly or haphazardly stacked substrate layers can lift and detrimentally redeposit onto the semiconductor wafer. The redeposited substrate material can contaminate the semiconductor wafer and cause defects in the integrated circuit devices formed on the wafer. Additionally, random or haphazardly stacked layers at the edge of the semiconductor wafer often leave certain substrate layers detrimentally exposed to the ambient.

Furthermore, random or haphazard stacking of the substrate layers can also result in having a substrate layer inadvertently placed into contact with an underlying substrate layer to which the overlying layer will not stick. In such an instance, the overlying layer will tend to peel from the underlying layer and detrimentally redeposit onto the semiconductor wafer. For example, a metal layer placed directly on top of a polysilicon layer will often peel from the polysilicon layer, thereby contaminating the semiconductor wafer and causing defects in the integrated circuitry devices formed thereon. Methods of forming uniformly-stacked layers for reducing such edge-related defects are described in commonly-assigned U.S. Pat. No. 5,618,380, the disclosure of which is incorporated by reference herein.

This invention arose out of concerns associated with providing methods and structures for calibrating semiconductor processing equipment, and in particular, wafer coating systems.

SUMMARY OF THE INVENTION

Semiconductor wafer coating system calibration structures and methods are described. In one embodiment, a calibration structure includes a perimetral edge bounding a calibration body. A calibration edge is spaced from the perimetral edge and is positioned over the calibration body. Together, the edges define a distance therebetween which is configured to calibrate a wafer coating system. In a preferred embodiment, the edges define respective termination distances configured to calibrate multiple different wafer coating systems. In another embodiment, a calibration pattern is formed over a semiconductor wafer. A layer of material is formed over the calibration pattern by a coating system, and selected portions thereof removed by the system. The positions of unremoved portions of the layer of material are inspected relative to the calibration pattern to ascertain whether the coating system removed the selected portions within desired tolerances. If not, the coating system is calibrated to within desired tolerances.

BRIEF DESCRIPTION OF THE DRAWINGS

Preferred embodiments of the invention are described below with reference to the following accompanying drawings.

FIG. 1 is a top plan view of a calibration structure in accordance with one embodiment of the invention.

FIG. 2 is a top plan view of a calibration structure in accordance with another, more preferred embodiment of the present invention.

DETAILED DESCRIPTION OF THE PREFERRED EMBODIMENTS

Figure 3:
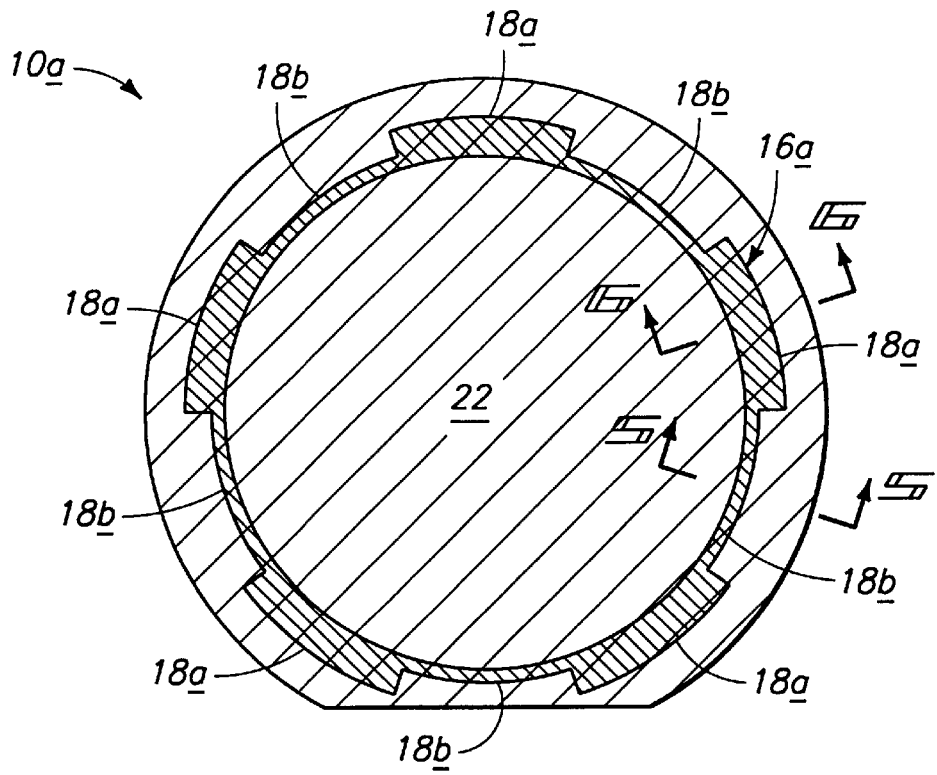
FIG. 3 is a view of the FIG. 2 calibration structure at a processing step which is different from that which is shown in FIG. 2.

During the fabrication of integrated circuit devices, numerous substrate layers are deposited over the entire surface of the semiconductor wafer. Commonly, a layer of photoresist material is then applied and spun over the entire surface of each substrate layer. Portions of the photoresist layer are removed from the substrate layer using various processes. The remaining photoresist forms a mask which protects the underlying substrate layer from subsequent processes such as, for example, etching. Edge bead removal processes and systems determine how close to the edge of the semiconductor wafer an underlying substrate layer remains after an etching process. For example, if the edge bead removal process extends inward 3 mm from the edge of the semiconductor wafer, that portion of the underlying substrate layer residing 3 mm from the edge of semiconductor wafer will no longer have photoresist thereon. During subsequent etching processes, the uncovered portion of the underlying substrate layer is removed. Therefore, the remaining underlying substrate layer extends to within 3 mm of the edge of the semiconductor wafer.

Referring to FIG. 1, a calibration structure is shown generally at 10 and is configured for use with one, and preferably multiple different semiconductor coating systems. As used in this document, the term "coating system" will be understood to refer to a system which both applies and selectively removes a layer of material such as photoresist. Such system can comprise an integral unit, or separate units arranged to function as described above and below. In a preferred embodiment, such systems comprise edge bead removal units, such as chemical edge bead removal units and optical edge bead removal units. The calibration structure(s) described below facilitate calibration of one or more systems, and standardization of multiple different processing units to a predetermined removal standard.

Calibration structure 10 includes a perimetral or outer edge 12 which bounds a calibration body 14, and that has a shape which defines the periphery of the calibration body. In the illustrated and preferred embodiment, calibration structure 10 comprises a semiconductor wafer such as a silicon wafer.

A calibration pattern 16 is provided on or over wafer 10. The calibration pattern defines one or more points of reference from which alignment of overlying layers can be judged. In turn, this enables one to ascertain whether an overlying layer is aligned within desired tolerances relative to the calibration pattern. In one preferred embodiment, calibration pattern 16 is provided by forming a layer of material such as oxide, nitride, or the like, over the wafer, and patterning and etching the layer to define the calibration pattern. Preferably, the material comprising the calibration pattern is selected so that the calibration structure can be used over and over again in the context of multiple coating systems. The definition of the calibration pattern preferably forms one or more calibration lines or edges 18 which are spaced inwardly from perimetral edge 12 and positioned over calibration body 14. The preferred calibration edge(s), together with perimetral edge 12 define a distance $d_n$, therebetween which is configured to calibrate a wafer coating system as will become apparent below. The calibration pattern set forth in FIG. 1 is but one example of a calibration pattern which can be implemented in accordance with the invention, and is intended to be non-limiting.

In the illustrated example, calibration edges 18 define, relative to perimetral edge 12, a plurality of spaced, different selected distances. For example, a plurality of distances $d_1$–$d_5$ are shown. These distances can represent one or more standards or design tolerances relative to which overlying layers are desired to be formed. The calibration structure can be utilized over and over, in connection with different coating systems to provide an effective standard which is useful for calibrating such systems. The illustrated calibration pattern 16 has a calibration edge 18 (the rightmost calibration edge 18) which has a generally stepped appearance when viewed from over the calibration body. The illustrated calibration pattern also includes a plurality of space-apart, non-contiguous edges 18 (the leftmost calibration edges) which define separate, but related pattern portions. In the illustrated example, distances $d_1$–$d_5$ are so-called "termination distances". A termination distance is simply defined as the distance between the edge of a substrate layer from an edge, e.g. perimetral edge 12, of a wafer.

Calibration pattern 16 can be considered as including a plurality of calibration edges 18 which, in this example, generally follow the shape of perimetral edge 12. Individual joinder edges 20 are provided and are joined with and extend between differently-spaced calibration edges. The joinder edges extend generally away from perimetral edge 12. In this example, the calibration pattern is distributed about less than an entirety of a wafer portion proximate the periphery. The calibration pattern can, however, be distributed about an entirety of the wafer's periphery, as will become apparent below.

Referring to FIG. 2, another, more preferred embodiment is set forth generally at 10a. Like numerals from the above-described embodiment are utilized where appropriate, with differences being indicated with the suffix "a".

A different calibration pattern 16a is provided, and is one in which first and second respective calibration edges 18a, 18b define, in part, a generally contiguous calibration pattern which is distributed about an entirety of the wafer's periphery. Edges 18a, 18b are disposed in an alternating fashion proximate perimetral edge 12. First and second edges 18a, 18b generally follow at least a portion of outer edge 12 and are connected by individual joinder edges 20a. First and second edges 18a, 18b are spaced inwardly of outer edge 12 different respective distances. In the illustrated example, the different respective distances define a specification which includes an allowed variance. For example, distance $d_{1a}$ is approximately 2.3 mm from outer edge 12, while distance $d_{2a}$ is approximately 2.7 mm from outer edge 12. In this example, the specification for a termination distance is 2.5 mm, plus or minus 0.2 mm. Of course, other distances can be used depending on the desired specification; and, more than two termination distances can be defined about the periphery of the wafer.

In another aspect, the material comprising calibration patterns 16, 16a (FIGS. 1 and 2) can be selected to provide a visually-or optically-discernable color-contrasting relationship with an underlying layer or the wafer. Such can facilitate visual or other inspection of the wafer as will become apparent below. Accordingly, the calibration pattern can comprise a first color and the wafer, or underlying layer, can comprise a second color intermediate first and second edges 18a, 18b and perimetral edge 12, with the second color being different.

In use, the present invention provides a standard by which one, and preferably more, semiconductor wafer coating systems can be calibrated. This greatly facilitates processing of semiconductor wafers which, in the past and in the context of edge bead removal units, have typically required measurement of termination distances with the use of manual calipers. Such can, to say the least, consume valuable processing time and slow throughput of the wafers.

FIGS. 3–7 illustrate certain methodical aspects of the present invention in the context of the provided FIG. 2 calibration structure.

Referring to FIG. 3, calibration structure 10a is typically placed in a first coating system through which a first or different material layer 22 is formed over calibration pattern 16a. An exemplary material for layer 22 comprises a masking material such as photoresist.

Figure 4:
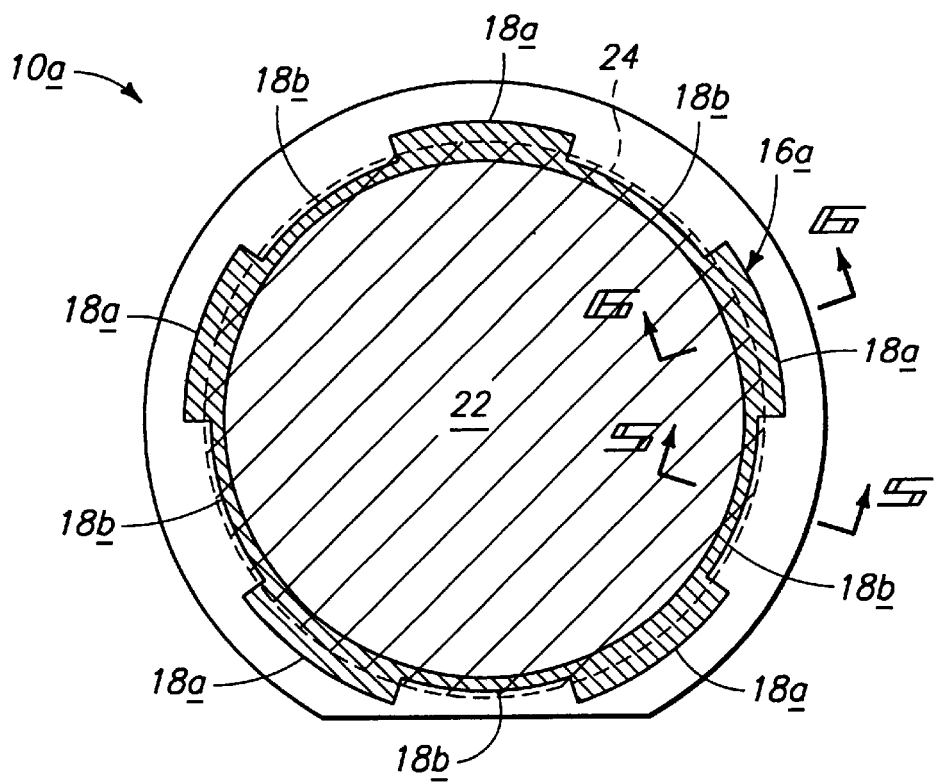
FIG. 4 is a view of the FIG. 3 calibration structure at a processing step which is different from that which is shown in FIG. 3.

Referring to FIG. 4, selected portions of layer 22 are removed sufficient to define a material edge 24, set off for clarity purposes with a dashed line. Where layer 22 comprises photoresist, the removal of the selected portions can comprise exposing the photoresist to selected light, and developing the layer sufficiently to remove selected portions thereof as by an optical edge bead removal process. Such removal or developing can also comprise utilizing a chemical edge bead removal process. Other methods can, of course, be used. Such provides a first patterned masking layer over calibration pattern 16a.

Figure 5:
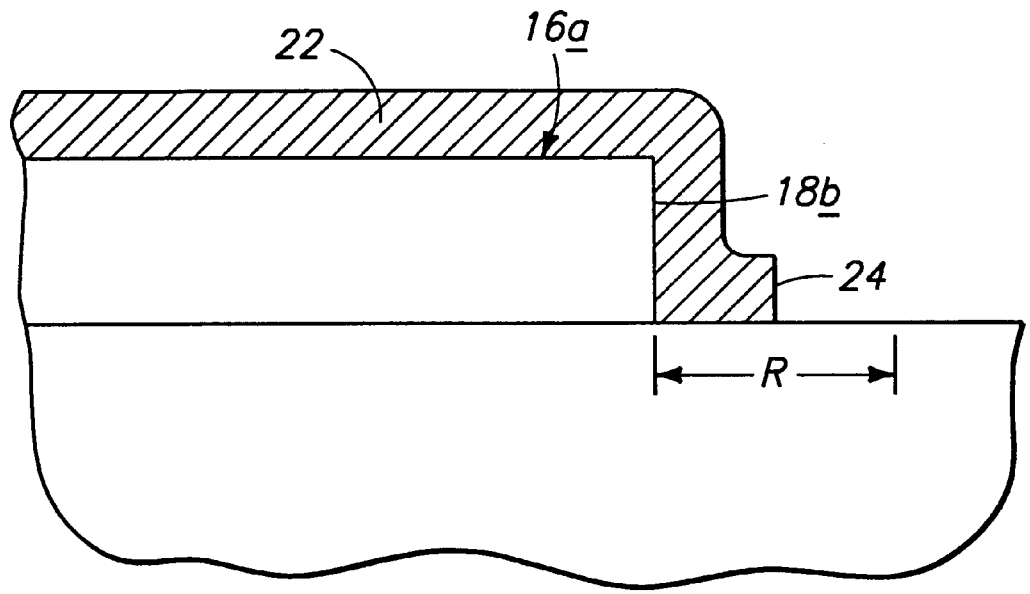
FIG. 5 is a view which is taken along line 5—5 in FIG. 4.
Figure 6:
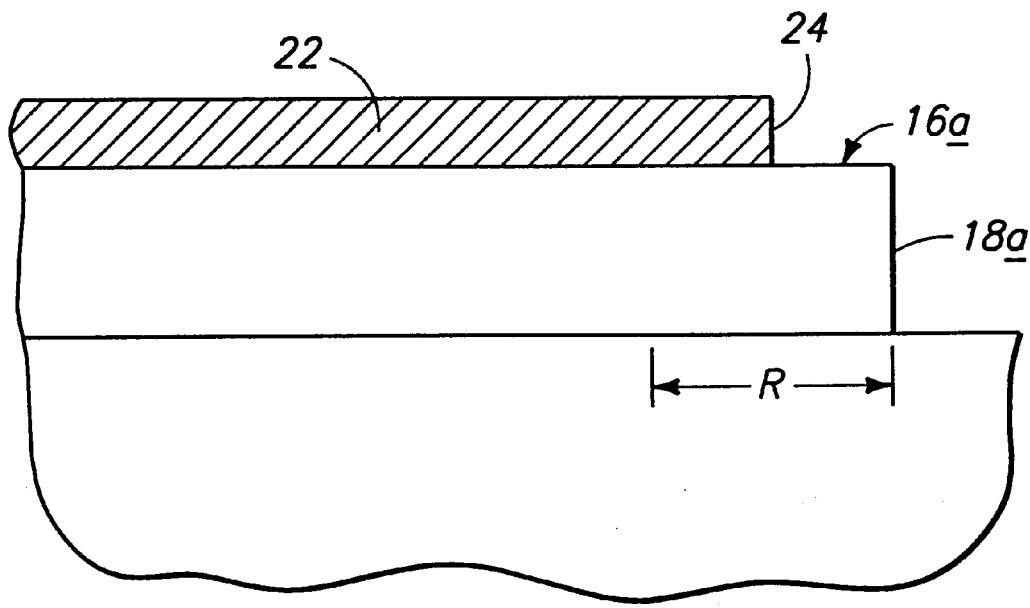
FIG. 6 is a view which is taken along line 6—6 in FIG. 4.
Figure 7:
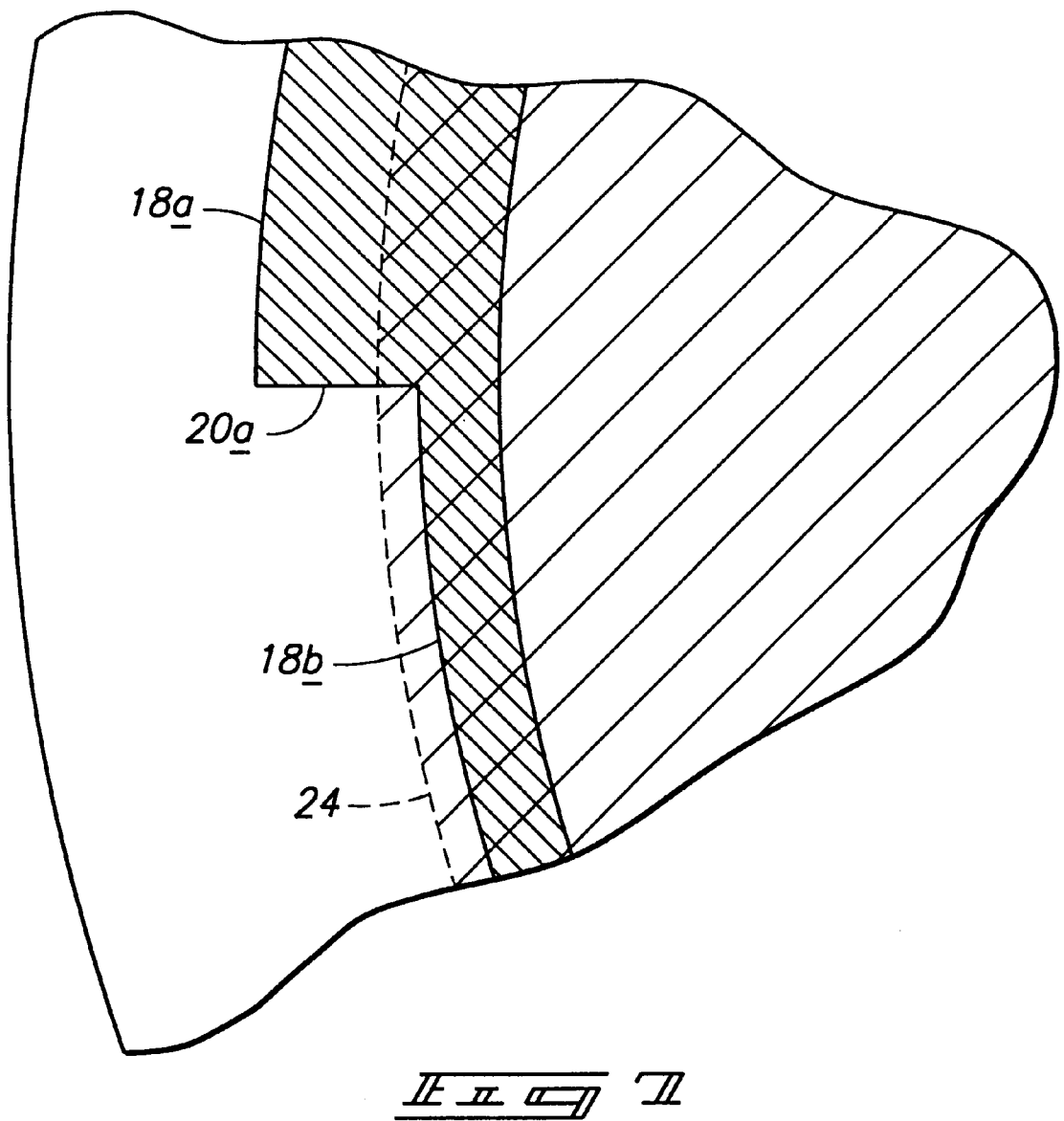
FIG. 7 is an enlarged plan view of a portion of the FIG. 6 calibration structure, as it might appear during calibration.

Referring to FIGS. 5–7, after removal of the selected portions of layer 22, the position of the patterned masking layer is inspected relative to calibration pattern 16a, to ascertain whether the coating system utilized to deposit and remove layer 22, did so in a manner which is consistent with, or within desired tolerances. If the selected portions were not removed within the desired tolerances, the coating system can be used to deposit another layer such as layer 22, and again tested to ascertain tolerance conformity. Such can typically involve removing the previously-formed layer 22 entirely from over wafer body 14, reapplying the layer, removing the selected portions after calibration of the coating system, and inspecting the results. The inspection of the unremoved portions of layer 22 can be conducted relative to one or more of the distances defined by first and second edges 18a, 18b.

In a preferred embodiment, inspection of layer 22 comprises determining whether material edge 24 is disposed in a desired position relative to first and second edges 18a, 18b. In a most preferred embodiment, inspection comprises ascertaining whether material edge 24 is disposed intermediate or between first and second edges 18a, 18b when viewed from over the wafer. Such a range is shown in FIG. 5 and 6 by arrow R. FIG. 7 shows a desired alignment where material edge 24 can be seen to be disposed between or intermediate edges 18a, 18b. If material edge 24 falls outside of edge 18a or inside of edge 18b, one can ascertain that layer 22 was patterned outside of desired tolerances and hence the coating system is in need of calibration.

After calibration of a first coating system is either confirmed, or adjusted and reconfirmed, patterned masking layer 22 can be removed from over wafer body 14. Subsequently, a second and different coating system can be used, and a second patterned masking layer can be formed over calibration pattern 16a substantially as described above with respect to the first patterned masking layer. Subsequently, the position of the second patterned masking layer can be inspected relative to calibration pattern 16a to ascertain whether the coating system performed within desired tolerances. If not, the coating system can be calibrated to within desired tolerances. In this way, it will be appreciated, multiple different semiconductor wafer coating systems can be calibrated to a common standard. Such systems can include, without limitation, edge bead removal units such as chemical and optical edge bead removal units.

Calibration structure or wafer 10 provides a standardized structure which can be used over and over, quickly and conveniently between different and unrelated systems. Such greatly facilitates processing of semiconductor wafers which, many times, occurs in an assembly line fashion. Eliminating the need to manually measure, with calibers or other means, the alignment of applied masking layers provides time saving measures which greatly speeds up processing of wafers and increases throughput.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A calibration method of calibrating a semiconductor wafer coating system comprising:

providing a semiconductor wafer having a calibration pattern;

using a coating system, forming a layer of material over the calibration pattern and removing selected portions of the layer of material; and inspecting the position of unremoved portions of the layer of material relative to the calibration pattern to ascertain whether said coating system removed said selected portions within desired tolerances, and if not, calibrating said coating system, wherein said wafer has an outer edge having a shape which defines the wafer's periphery, and:

the calibration pattern comprises first and second calibration edges which generally follow at least a portion of said outer edge shape, said removing of said selected portions of said layer of material defines a material edge, and said inspecting comprises determining whether said material edge is disposed in a desired position relative to said first and second edges, wherein said first and second calibration edges are disposed at different respective distances relative to said wafer's outer edge, and wherein said inspecting comprises ascertaining whether said material edge is disposed intermediate said first and second edges when viewed from over the wafer.

2. A calibration method of calibrating a semiconductor wafer coating system comprising:

providing a semiconductor wafer having a calibration pattern;

using a coating system, forming a layer of material over the calibration pattern and removing selected portions of the layer of material; and inspecting the position of unremoved portions of the layer of material relative to the calibration pattern to ascertain whether said coating system removed said selected portions within desired tolerances, and if not, calibrating said coating system, wherein said wafer has an outer edge having a shape which defines the wafer's periphery, and:

the calibration pattern comprises first and second calibration edges which generally follow at least a portion of said outer edge shape, said removing of said selected portions of said layer of material defines a material edge, and said inspecting comprises determining whether said material edge is disposed in a desired position relative to said first and second edges, wherein:

said first and second calibration edges comprise a plurality of first and second calibration edges at different respective distances relative to said wafer's outer edge, said plurality of calibration edges being disposed in an alternating fashion about the wafer's periphery; and said inspecting comprises ascertaining whether said material edge is disposed intermediate the first and second calibration edges when viewed from over the wafer.

3. A semiconductor processing method of ascertaining layer alignment during processing comprising:

forming a layer of material over a calibration substrate, said calibration substrate having a perimetral edge bounding an interior calibration body;

patterning and etching said layer of material to define a plurality of calibration edges positioned over said calibration body and spaced different selected distances from said perimetral edge, said distances being configured to calibrate a semiconductor wafer coating system;

using the semiconductor wafer coating system, forming a different layer of material over the calibration substrate and removing said different layer sufficient to remove selected portions of the different layer from over the substrate; and inspecting the position of unremoved portions of the different layer of material relative to one of the selected distances to ascertain whether said coating system removed said selected portions within desired tolerances, wherein said removing of said different layer of material defines a material edge, and said inspecting comprises ascertaining whether said material edge is disposed between two of said calibration edges when viewed from over said substrate.

4. A semiconductor processing method of ascertaining layer alignment during processing comprising:

forming a layer of material over a calibration substrate, said calibration substrate having a perimetral edge bounding an interior calibration body;

patterning and etching said layer of material to define a plurality of calibration edges positioned over said calibration body and spaced different selected distances from said perimetral edge, said distances being configured to calibrate a semiconductor wafer coating system;

using the semiconductor wafer coating system, forming a different layer of material over the calibration substrate and removing said different layer sufficient to remove selected portions of the different layer from over the substrate; and inspecting the position of unremoved portions of the different layer of material relative to one of the selected distances to ascertain whether said coating system removed said selected portions within desired tolerances, wherein said calibration substrate's perimetral edge has a shape which defines the substrate's periphery, and:

said patterning and etching comprises forming said calibration edges to generally follow at least a portion of said perimetral edge shape, said removing of said different layer of material defines a material edge, and said inspecting comprises ascertaining whether said material edge is disposed in a desired position relative to said calibration edges when viewed from over said substrate, wherein said inspecting comprises ascertaining whether said material edge is disposed intermediate said plurality of calibration edges when viewed from over said substrate.

5. The calibration method of claim 4, wherein the etching of said layer of material to define said plurality of calibration edges comprising forming said edges to alternate thereby defining different first and second distances relative to said perimetral edge.

* * * * *